United States Patent [19]

Nishikubo

[11] 4,326,277

[45] Apr. 20, 1982

[54] ELECTRONIC TIMEPIECE

[75] Inventor: Yasuhiko Nishikubo, Iruma, Japan

[73] Assignee: Citizen Watch Co., Ltd., Tokyo, Japan

[21] Appl. No.: 11,853

[22] Filed: Feb. 13, 1979

[30] Foreign Application Priority Data

Feb. 17, 1978 [JP] Japan .................................. 53/17453

[51] Int. Cl.³ ........................ G04C 19/00; G04C 9/00; H03K 21/00

[52] U.S. Cl. ........................................ 368/86; 368/156; 368/187; 368/204; 307/225 R

[58] Field of Search .................... 368/66, 82, 155, 159, 368/187, 203–204, 85–87, 217–219; 307/220 R, 221 R, 223 R, 225 R, 247 A

[56] References Cited

U.S. PATENT DOCUMENTS 3,678,680 7/1972 Fujija ...................................... 368/155
3,788,058 1/1974 Idei et al. ................................ 368/82
3,979,608 9/1976 Sekita et al. .......................... 307/247 A
4,130,988 12/1978 Scherrer et al. ................. 307/279 X
4,133,169 1/1979 Scherrer et al. ...................... 368/159
4,138,841 2/1979 Komaki et al. ....................... 368/155

*Primary Examiner*—Vit W. Miska
*Attorney, Agent, or Firm*—Birch, Stewart, Kolasch & Birch

[57] ABSTRACT

A electronic timepiece having a dynamic frequency divider, a static frequency divider and a reset system, in which a switching means is provided in the voltage supply circuit of the dynamic frequency divider and a gate means is provided between the dynamic frequency divider and the static frequency divider. The switching means is a transistor adapted to be cut off to stop the operation of the dynamic frequency divider in the reset state and the gate means is a digital logic gate adapted to fix the output thereof by an input voltage applied by the reset system, whereby power consumption in the dynamic frequency divider and in the static frequency divider may be reduced.

4 Claims, 4 Drawing Figures

ELECTRONIC TIMEPIECE

BACKGROUND OF THE INVENTION

The present invention relates to an electronic timepiece having a quartz crystal oscillator for producing a time standard signal, a frequency divider, a display driver and a display.

There is provided an electronic timepiece employing the complementary MOS (CMOS) transistor, in which the frequency divider comprises a dynamic frequency divider and a static frequency divider. In the conventional electronic timepiece, although the static frequency divider stops operating in the reset state, the dynamic frequency divider continues to operate. Therefore, a great reduction in power consumption in the reset state may not be expected.

SUMMARY OF THE INVENTION

An object of the present invention is to provide an electronic timepiece in which power consumption in the reset state may be reduced.

In accordance with the present invention, the electronic timepiece comprises an oscillator for producing a time standard signal, a dynamic frequency divider, a static frequency divider, display driver, a display, a reset system connected to reset terminals of said static frequency divider, a switch means provided in the voltage supply circuit for said dynamic frequency divider, and a gate means provided between said dynamic frequency divider and said static frequency divider, said switch means being adapted to be opened in the reset state and said gate means is adapted to pass the output of said dynamic frequency divider in the set state and to fix the output thereof in the reset state.

Further objects, features and advantages of the present invention will become apparent from following description taken in conjunction with the accompanying drawings.

DESCRIPTION OF THE PREFERRED EMBODIMENTS

Figure 1:
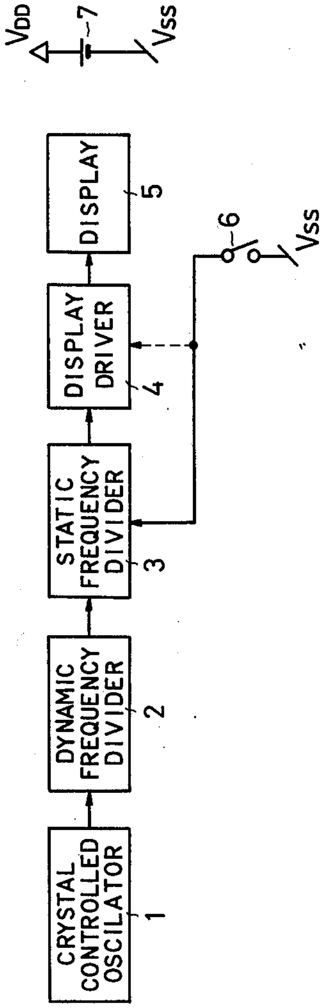
FIG. 1 is a block diagram showing a conventional quartz crystal electronic timepiece.

Referring to the drawings and more particularly to FIG. 1 showing a conventional electronic timepiece, the timepiece comprises a crystal controlled oscillator 1, a dynamic frequency divider 2, a static frequency divider 3, a display driver 4, a display 5, a reset switch 6, and a power source 7. The reset system is provided to apply negative voltage $V_{SS}$ to reset terminals of the static frequency divider 3 and the display driver 4. In this system, although the potential of the static frequency 3 and the display driver 4 is fixed by closing the switch 6, the oscillator 1 and the dynamic frequency divider 2 continue to operate. Consequently, power consumption is not conserved. The present invention is designated to remove such a disadvantage.

Figure 2:
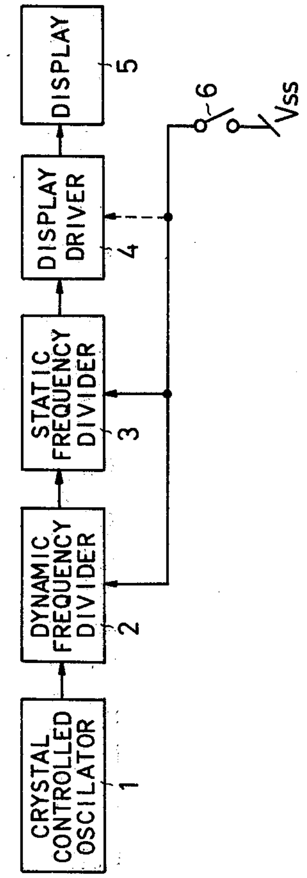
FIG. 2 is a block diagram showing a quartz crystal electronic timepiece according to the present invention.
Figure 3:
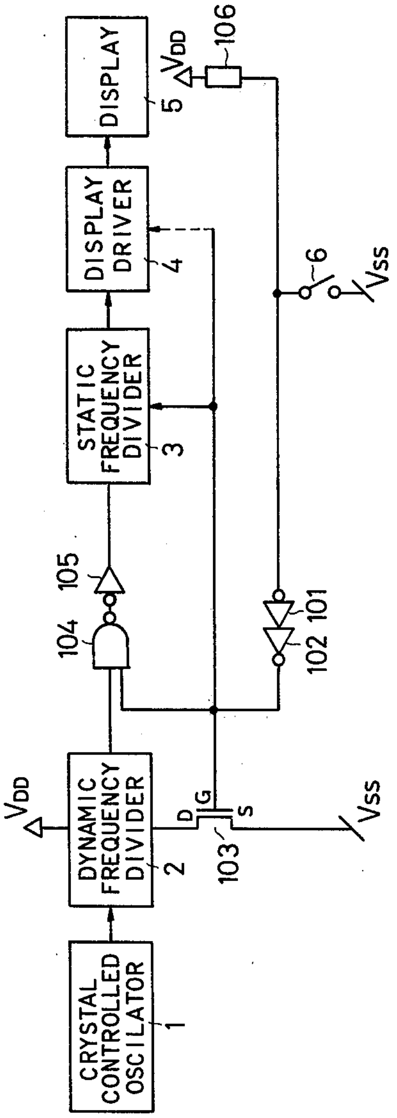
FIG. 3 is a block diagram showing an embodiment of the present invention.

Referring to FIG. 2, the reset system is provided to operate the dynamic frequency divider 2 in accordance with the present invention. Referring to FIG. 3, the dynamic frequency divider is connected to a negative voltage source $V_{SS}$ through a n-channel MOS transistor 103. Output of the dynamic frequency divider 2 is connected to the static frequency divider 3 through a NAND gate 104 and an invertor 105. In the set state, a positive voltage $V_{DD}$ is applied to the gate G of the transistor 103, NAND gate 104 and reset terminals of the static frequency divider 3 and display driver 4 through inverters 101 and 102 and a pull-up resistor 106. Therefore, the n-channel MOS transistor 103 is ON and output of the NAND gate 104 is voltage $V_{SS}$ which is inverted by the inverter 105 to operate the static frequency divider 3. Thus, the system operates in the normal state.

When the reset switch 6 is closed, the n-channel MOS transistor 103 becomes OFF so that current does not flow. At this time, although output of the dynamic frequency divider 2, that is, one of the inputs of the NAND gate is unfixed, the other input of the NAND gate is $V_{SS}$. Accordingly, the output of the NAND gate is $V_{DD}$ and fixed $V_{SS}$ is applied to the static frequency divider 3 to stop the operation thereof.

Thus, in accordance with the present invention, power is not consumed in the dynamic frequency divider, and also in the static frequency divider, since the input voltage thereof is fixed.

Figure 4:
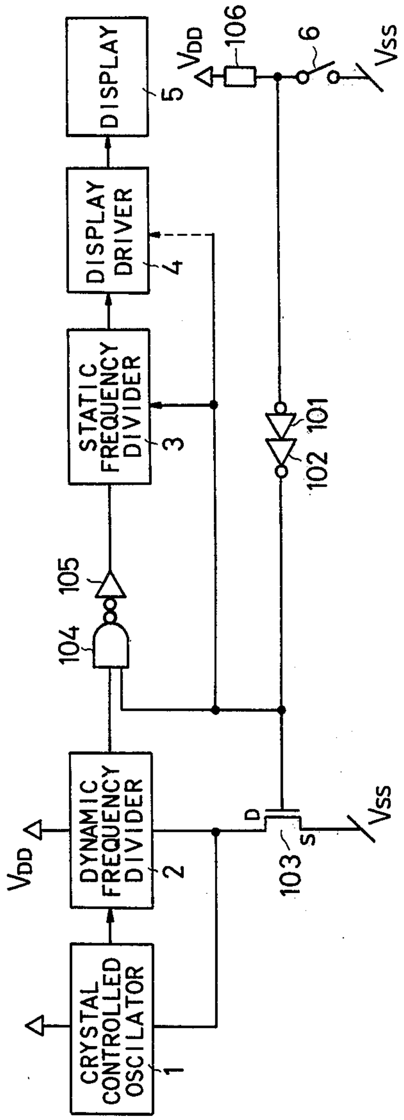
FIG. 4 is a block diagram showing another embodiment of the present invention.

Referring to FIG. 4 showing another embodiment of the present invention, the oscillator 1 is also connected to the negative voltage $V_{SS}$ through the n-channel MOS transistor 103. Therefore, the oscillating operation in the oscillator 1 is stopped in the reset state. Thus, it is possible to reduce the power consumption to a small amount near to zero.

Although the n-channel MOS transistor is employed in the $V_{SS}$ side of the dynamic frequency divider in the above mentioned embodiment, p-channel MOS transistor may be employed in the $V_{DD}$ side or other gate means may be provided to stop the oscillation.

From the foregoing it will be understood that the present invention may provide a reset system which may stop the operation of the dynamic frequency divider in the reset state and this is especially advantageous to the system employing a high frequency crystal quartz of MHZ order.

What is claimed is:

1. An electronic timepiece comprising:

oscillator means for producing a time standard signal;

dynamic frequency divider means connected to an output terminal of said oscillator means for dividing the frequency of said time standard signal;

static frequency divider means connected to an output terminal of said dynamic frequency divider means for dividing the frequency of an output signal from said dynamic frequency divider means;

display driver means connected to an output terminal of said static frequency divider means for driving a display means;

a said display means connected to an output terminal of said display driver means for providing a time information display;

reset system means connected to a reset terminal of said static frequency divider means;

switch means connected to said reset system means and disposed in the voltage supply circuit of said dynamic frequency divider means; and gate means connected between said dynamic frequency divider means and said static frequency divider means and further connected to said reset system means, said switch means being open when the reset system means is in the reset state, said gate means passing the output signal from said dynamic frequency divider means when said reset system means is in the set state and fixing the output thereof when said reset system means is in the reset state.

2. An electronic timepiece according to claim 1, wherein said switch means comprises an MOS transistor, said reset system means applying a voltage to the gate of said MOS transistor causing said transistor to conduct to an OFF state when said reset system means is in a reset state.

3. An electronic timepiece according to claim 1, wherein said gate means comprises a digital logic gate, said reset system means applying a voltage to said gate thereby fixing the output voltage thereof.

4. An electronic timepiece comprising:

oscillator means for producing a time standard signal;

dynamic frequency dividing means connected to an output terminal of said oscillator means for dividing the frequency of said time standard signal;

static frequency dividing means connected to an output terminal of said dynamic frequency divider means for dividing the frequency of an output signal from said dynamic frequency divider means;

display driver means connected to an output terminal of said static frequency divider means for driving a display means;

a said display means connected to an output terminal of said display driver means for providing a time information display;

reset system means connected to a reset terminal of said static frequency divider means;

switch means connected to said reset system means and disposed in the voltage supply circuit of said dynamic frequency divider means and said oscillator means; and gate means connected between said dynamic frequency divider means and said static frequency divider means and further connected to said reset system means;

said switch means being open when the reset system means is in the reset state, said gate means passing the output signal from said dynamic frequency divider means when said reset system means is in the set state and fixing the output thereof when said reset system means in the reset state.

* * * * *